(12) United States Patent
Hsieh et al.

(10) Patent No.: US 12,388,194 B2
(45) Date of Patent: Aug. 12, 2025

(54) ANTENNA-IN-MODULE PACKAGE-ON-PACKAGE WITH AIR TRENCHES

(71) Applicant: MEDIATEK INC., Hsin-Chu (TW)

(72) Inventors: Ya-Jui Hsieh, Hsinchu (TW); Chi-Yuan Chen, Hsinchu (TW); Shih-Chao Chiu, Hsinchu (TW); Yao-Pang Hsu, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 154 days.

(21) Appl. No.: 18/113,606

(22) Filed: Feb. 23, 2023

(65) Prior Publication Data

US 2023/0307849 A1  Sep. 28, 2023

Related U.S. Application Data

(60) Provisional application No. 63/322,250, filed on Mar. 22, 2022.

(51) Int. Cl.
*H01Q 1/22* (2006.01)
*H01L 25/16* (2023.01)
*H01Q 9/04* (2006.01)
*H01Q 21/08* (2006.01)

(52) U.S. Cl.
CPC ............. *H01Q 21/08* (2013.01); *H01L 25/16* (2013.01); *H01Q 9/0407* (2013.01)

(58) Field of Classification Search
CPC .......... H01Q 1/22; H01Q 1/38; H01Q 9/0407; H01Q 21/08; H01Q 21/065
See application file for complete search history.

(56) References Cited

U.S. PATENT DOCUMENTS

| | | | |
|---|---|---|---|
| 2009/0096679 A1 | 4/2009 | Harokopus | |
| 2016/0056544 A1* | 2/2016 | Garcia | H01Q 9/0407 343/725 |
| 2020/0112081 A1* | 4/2020 | Kim | H01L 24/16 |
| 2020/0259269 A1 | 8/2020 | Kim | |
| 2021/0126341 A1 | 4/2021 | Mizunuma | |
| 2023/0282972 A1* | 9/2023 | Tang | H01Q 21/065 343/700 R |

FOREIGN PATENT DOCUMENTS

EP  3 859 877 A1  8/2021

* cited by examiner

*Primary Examiner* — Hasan Islam
(74) *Attorney, Agent, or Firm* — Winston Hsu

(57) ABSTRACT

An antenna-in-module package-on-package includes an antenna package having a top surface and a bottom surface opposing the top surface. The antenna package includes a radiative antenna element on the bottom surface. A chip package is mounted on the top surface of the antenna package. The chip package includes a semiconductor chip. Conductive elements are disposed between the antenna package and the chip package to electrically interconnect the chip package and the antenna package. A radiative antenna element is disposed on the bottom surface of the antenna package. At least one air trench is disposed on the bottom surface of the antenna package.

14 Claims, 2 Drawing Sheets

ANTENNA-IN-MODULE PACKAGE-ON-PACKAGE WITH AIR TRENCHES

CROSS REFERENCE TO RELATED APPLICATIONS

This application claims the benefit of U.S. Provisional Application No. 63/322,250, filed on Mar. 22, 2022. The content of the application is incorporated herein by reference.

BACKGROUND

The present disclosure relates to the field of semiconductor packaging. More particularly, the present disclosure relates to an antenna-in-module package-on-package (AiMPoP) with air trenches.

Antenna in Package (AiP) or antenna in module (AiM) technology is an antenna packaging solution that implements an antenna or antennas in an IC package that can carry a bare RF chip (transceiver). An antenna-in-module package-on-package (AiMPoP), which is composed of a chip module and a discrete antenna module, has advantages of short substrate lead time, better substrate yield and flexible design, compared to conventional AiM.

However AiMPoP structure has solder height control problem during SMT process due to substrate warpage.

SUMMARY

One object of the present invention is to provide an improved board-level ball pad pattern in order to solve the prior art problems or shortcomings.

One aspect of the invention provides an antenna-in-module package-on-package including an antenna package having a top surface and a bottom surface opposing the top surface, wherein the antenna package comprises a radiative antenna element on the bottom surface; a chip package mounted on the top surface of the antenna package, wherein the chip package comprises a semiconductor chip; conductive elements disposed between the antenna package and the chip package to electrically interconnect the chip package and the antenna package; a radiative antenna element disposed on the bottom surface of the antenna package; and at least one air trench disposed on the bottom surface of the antenna package.

According to some embodiment, the radiative antenna element comprises antenna patches arranged in one row in a lengthwise direction of the antenna package.

According to some embodiment, the at least one air trench is disposed between the antenna patches and traverses the bottom surface of the antenna package in a widthwise direction.

According to some embodiment, the at least one air trench is disposed in a region that directly overlaps with the chip package.

According to some embodiment, the antenna-in-module package-on-package further comprises a connector disposed on the top surface of the antenna package.

According to some embodiment, the at least one air trench does not overlap with the connector.

According to some embodiment, the antenna package comprises a core and build-up layers on each side of the core.

According to some embodiment, the antenna package further comprises a solder mask layer on the build-up layer.

According to some embodiment, the at least one air trench penetrates through the solder mask layer and the build-up layer.

According to some embodiment, the at least one air trench further partially cuts into the core.

According to some embodiment, the at least one air trench is a straight-line-shaped trench.

According to some embodiment, the antenna package has a rectangular shape.

According to some embodiment, the semiconductor chip comprises a RF chip.

According to some embodiment, the chip package further comprises at least one passive device installed on a package substrate in a region that is in proximity to the semiconductor chip.

According to some embodiment, at least one passive device comprises a decoupling capacitor, an inductor, or a resistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Figure 1:
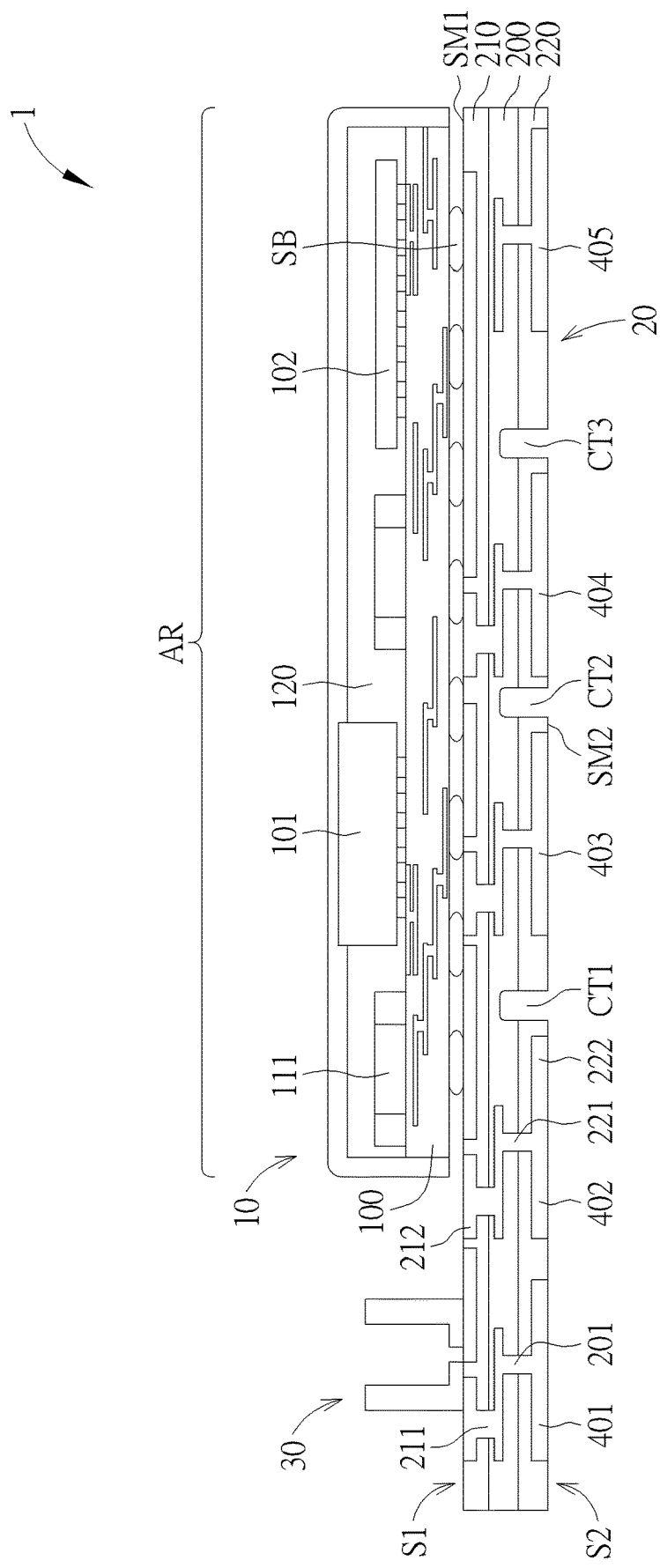
FIG. 1 is a schematic, cross-sectional diagram showing an exemplary antenna-in-module package-on-package (AiMPoP) 1 in accordance with an embodiment of the invention.
Figure 2:
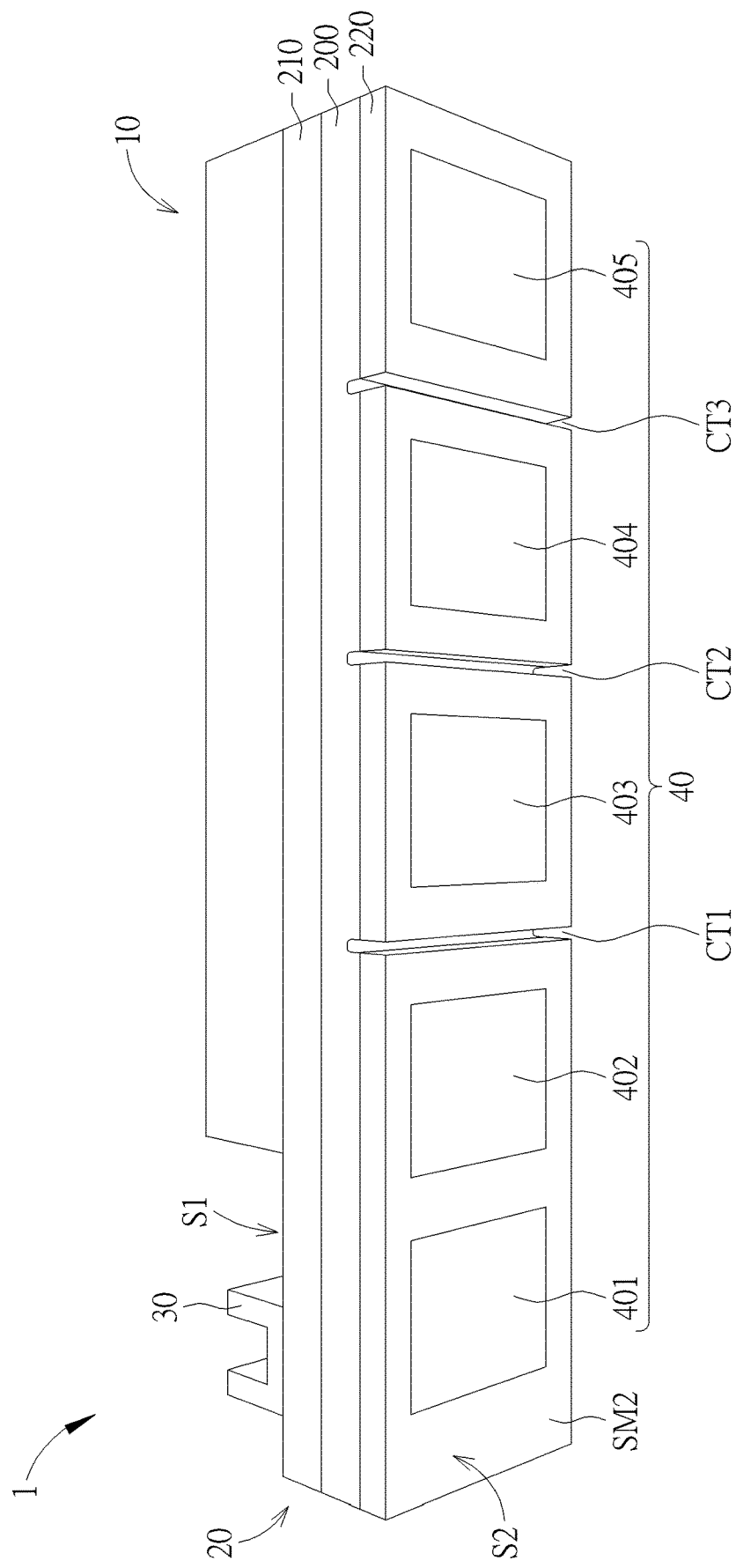
FIG. 2 is a perspective bottom view of the AiMPoP in FIG. 1.

Please refer to FIG. 1 and FIG. 2. FIG. 1 is a schematic, cross-sectional diagram showing an exemplary antenna-in-module package-on-package (AiMPoP) 1 in accordance with an embodiment of the invention. FIG. 2 is a perspective bottom view of the AiMPoP 1 in FIG. 1. As shown in FIG. 1 and FIG. 2, the AiMPoP 1 comprises a chip package 10 and a discrete antenna package (or radiative element package) 20. The antenna package 20 comprises a top surface S1 and an opposite bottom surface S2. The chip package 10 is mounted on the top surface S1 of the antenna package 20. According to an embodiment of the invention, the chip package 10 is electrically connected to the antenna package 20 through a plurality of conductive elements SB. According to an embodiment of the invention, the conductive elements SB may comprise, for example, solder balls, solder bumps, copper bumps, gold bumps, micro bumps or conductive pillars, but not limited thereto.

According to an embodiment of the invention, the chip package 10 may comprise a package substrate 100 and a semiconductor chip 101 installed on the package substrate 100. According to an embodiment of the invention, for example, the semiconductor chip 101 may comprise a radio frequency (RF) IC chip (or RF chip), a base-band IC chip, a System-in-Chip (SOC) die, but is not limited thereto. According to an embodiment of the invention, for example, at least one passive device 111 such as a decoupling capacitor, an inductor, or a resistor may be installed on the package substrate 100 in a region that is in proximity to the semiconductor chip 101.

According to an embodiment of the invention, the chip package 10 may further comprise a semiconductor chip 102 installed on the package substrate 100. According to an embodiment of the invention, for example, the semiconductor chip 102 may further comprise a memory chip 102, but is not limited thereto. According to an embodiment of the invention, the chip package 10 may further comprise an encapsulant 120 such as a resin molding compound that covers the semiconductor chip 101, the semiconductor chip 102, the passive device 111, and the top surface of the package substrate 100.

According to an embodiment of the invention, the AiMPoP 1 may further comprise a connector 30 or a surface mount device disposed on the top surface S1 of the antenna package 20. The connector 30 and the chip package 10 may be installed on the top surface S1 of the antenna package 20 in a side-by side manner. According to an embodiment of the invention, a connector 30 may be installed at an end portion of the antenna package 20 such that the connector 30 is able to carry high frequency signals and connect with a main board of a mobile device such as a mobile phone via a flexible printed circuit (FPC) board (not shown).

According to an embodiment of the invention, the antenna package 20 may have a rectangular shape having a dimension of, for example, 3.4 mm×22 mm. According to an embodiment of the invention, the antenna package 20 may comprise a core 200 with one or more plated through-holes 201. According to an embodiment of the invention, the antenna package 20 may comprise one or more build-up layers 210 formed on one side of the core 200 and one or more build-up layers 220 formed on the other side of the core 200. The build-up layers 210 and 220 may have one or more vias 211 and 221 and/or conductive traces 212 and 222 formed therein to route signals, ground, and/or power throughout the package. Conductive traces 212 on top surface S1 of the top build-up layer 210 may be in the form of one or more pads onto which the chip package 10 may be attached with conductive elements SB. It is to be understood that the structure and the number of the conductive layers are for illustration purposes only.

According to an embodiment of the invention, for example, the core 200 may include any suitable material comprising epoxy laminates of fiberglass sheets, prepreg, FR-4 material, FR-5 material, or any combinations thereof. The conductive traces 212, 222, the plated through-holes 201, and the vias 211, 221 may include any suitable conductive materials comprising copper, silver, gold, nickel, or combinations thereof. The build-up layers 210, 220 may include any suitable dielectric material comprising polyimide, prepreg, polymers, or the like.

According to an embodiment of the invention, the antenna package 20 may further comprise solder mask layers SM1 and SM2 on the build-up layers 210, 220. For interconnection purposes, the solder mask layers SM1 and SM2 may comprise openings on the top surface S1 of the antenna package 20 for exposing the corresponding pads in the conductive traces 212. According to an embodiment of the invention, a radiative antenna element 40 such as an antenna array including, but not limited to, antenna patches 401-405, which may be arranged in one row in a lengthwise direction of the antenna package 20, may be disposed on the bottom surface S2 of the antenna package 20.

According to an embodiment of the invention, the radiative antenna element 40 may comprise a mechanism for radiating and/or receiving electro-magnetic signals such as RF wireless signals or millimeter-wave (mmW) signals. For example, the radiative antenna element 40 may be of any suitable type, such as patch antennas, slot-coupled antenna, stacked patches, dipoles, monopoles, etc., and may have different orientations and/or polarizations. According to an embodiment of the invention, the radiative antenna element 40 may comprise multiple antenna modules, for example, a dual-band antenna element and a single-band antenna element, and not limited.

It is believed that the unbalanced copper ratios on top surface S1 and the bottom surface S2 of the antenna package 20 may lead to the substrate warpage problem during the SMT process. The present disclosure addresses this issue. As shown in FIG. 1 and FIG. 2, to mitigate the CTE (CTE: coefficient of thermal expansion) mismatch between the top surface S1 and the bottom surface S2 of the antenna package 20, a plurality of half-cut trenches (or air trenches) CT1-CT3 may be provided on the bottom surface S2 of the antenna package 20. According to an embodiment of the invention, the half-cut trenches CT1-CT3 may penetrate through the solder mask layer SM2 and the build-up layer 220, and may partially cut into the core 200. According to another embodiment of the invention, the half-cut trenches CT1-CT3 may penetrate through the solder mask layer SM2 and the build-up layer 220.

According to an embodiment of the invention, the half-cut trenches CT1-CT3 may be straight-line-shaped trenches and may traverse bottom surface S2 of the antenna package 20 in the widthwise direction. It is understood that the half-cut trenches CT1-CT3 may have other patterns or shapes depending upon design requirements. According to an embodiment of the invention, the half-cut trenches CT1-CT3 may be formed by using mechanical cutting methods known in the art, but is not limited thereto.

According to an embodiment of the invention, preferably, the half-cut trenches CT1-CT3 may be formed in a region AR that directly overlaps with the overlying chip package 10 to obtain better solder joint reliability (SJR) in Temperature Cycling on Board (TCoB) test or SMT processes. According to an embodiment of the invention, for example, the half-cut trench CT1 is disposed between the antenna patch 402 and the antenna patch 403, the half-cut trench CT2 is disposed between the antenna patch 403 and the antenna patch 404, and the half-cut trench CT3 is disposed between the antenna patch 404 and the antenna patch 405. According to an embodiment of the invention, preferably, no air trench is formed in the region under the connector 30, for example, the region between the antenna patch 401 and the antenna patch 402.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna-in-module package-on-package, comprising:
   an antenna package having a top surface and a bottom surface opposing the top surface, wherein the antenna package comprises a radiative antenna element on the bottom surface, wherein the antenna package comprises a core, a build-up layer on each side of the core, and a solder mask layer on the build-up layer;
   a chip package mounted on the top surface of the antenna package, wherein the chip package comprises a semiconductor chip;
   conductive elements disposed between the antenna package and the chip package to electrically interconnect the chip package and the antenna package; and
   at least one air trench disposed on the bottom surface of the antenna package.

2. The antenna-in-module package-on-package according to claim 1, wherein the radiative antenna element comprises antenna patches arranged in one row in a lengthwise direction of the antenna package.

3. The antenna-in-module package-on-package according to claim 2, wherein the at least one air trench is disposed between the antenna patches and traverses the bottom surface of the antenna package in a widthwise direction.

4. The antenna-in-module package-on-package according to claim 1, wherein the at least one air trench is disposed in a region that directly overlaps with the chip package.

5. The antenna-in-module package-on-package according to claim 1 further comprising:
   a connector disposed on the top surface of the antenna package.

6. The antenna-in-module package-on-package according to claim 5, wherein the at least one air trench does not overlap with the connector.

7. The antenna-in-module package-on-package according to claim 1, wherein the at least one air trench penetrates through the solder mask layer and the build-up layer.

8. The antenna-in-module package-on-package according to claim 7, wherein the at least one air trench further partially cuts into the core.

9. The antenna-in-module package-on-package according to claim 1, wherein the at least one air trench is a straight-line-shaped trench.

10. The antenna-in-module package-on-package according to claim 1, wherein the antenna package has a rectangular shape.

11. The antenna-in-module package-on-package according to claim 1, wherein the semiconductor chip comprises a RF chip.

12. The antenna-in-module package-on-package according to claim 1, wherein the chip package further comprises at least one passive device installed on a package substrate in a region that is in proximity to the semiconductor chip.

13. The antenna-in-module package-on-package according to claim 12, wherein the at least one passive device comprises a decoupling capacitor, an inductor, or a resistor.

14. A radio frequency package-on-package, comprising:
   a radiative element package having a top surface and a bottom surface opposing the top surface,
   wherein the radiative element package comprises a radiative element on the bottom surface;
   a chip package mounted on the top surface of the radiative element package, wherein the chip package comprises a semiconductor chip;
   conductive elements disposed between the radiative element package and the chip package to electrically interconnect the chip package and the radiative element package; and
   at least one air trench disposed on the bottom surface of the radiative element package, wherein the at least one air trench extends into the antenna package and has a trench depth that is greater than a thickness of the radiative antenna element.

* * * * *